(12) United States Patent
Hartig

(10) Patent No.: US 10,151,023 B2
(45) Date of Patent: Dec. 11, 2018

(54) LATERALLY ADJUSTABLE RETURN PATH MAGNET ASSEMBLY AND METHODS

(71) Applicant: Cardinal CG Company, Eden Prairie, MN (US)

(72) Inventor: Klaus H. W. Hartig, Avoca, WI (US)

(73) Assignee: CARDINAL CG COMPANY, Eden Prairie, MN (US)

( * ) Notice: Subject to any disclaimer, the term of this patent is extended or adjusted under 35 U.S.C. 154(b) by 81 days.

(21) Appl. No.: 15/193,507

(22) Filed: Jun. 27, 2016

(65) Prior Publication Data

US 2017/0369985 A1 Dec. 28, 2017

(51) Int. Cl.
- *C23C 14/34* (2006.01)
- *H01J 37/34* (2006.01)
- *C23C 14/35* (2006.01)

(52) U.S. Cl.
CPC .......... *C23C 14/3407* (2013.01); *C23C 14/35* (2013.01); *C23C 14/351* (2013.01); *H01J 37/345* (2013.01); *H01J 37/3405* (2013.01); *H01J 37/347* (2013.01); *H01J 37/3414* (2013.01); *H01J 37/3435* (2013.01); *H01J 37/3452* (2013.01); *H01J 37/3455* (2013.01); *H01J 37/3461* (2013.01); *H01J 2237/002* (2013.01)

(58) Field of Classification Search
CPC ... H01J 37/3455; H01J 37/345; H01J 37/3452
See application file for complete search history.

(56) References Cited

U.S. PATENT DOCUMENTS

| | | | |
|---|---|---|---|
| 4,309,266 A | 1/1982 | Nakamura et al. |
| 4,734,183 A | 3/1988 | Wirz et al. |
| 4,964,968 A | 10/1990 | Arita et al. |
| 5,399,253 A | 3/1995 | Gruenenfelder et al. |
| 5,415,754 A | 5/1995 | Manley et al. |
| 5,685,959 A | 11/1997 | Bourez et al. |
| 6,299,740 B1 | 10/2001 | Hieronymi et al. |
| 6,372,098 B1 | 4/2002 | Newcomb |
| 6,395,146 B2 | 5/2002 | Hieronymi et al. |
| 6,416,639 B1 | 7/2002 | De Bosscher et al. |
| 6,821,397 B2 | 11/2004 | Krassnitzer |
| 7,347,919 B2 | 3/2008 | Sato et al. |
| 7,368,041 B2 | 5/2008 | Krassnitzer |

(Continued)

FOREIGN PATENT DOCUMENTS

| | | |
|---|---|---|
| EP | 2009670 A1 | 12/2008 |
| EP | 2669403 A1 | 12/2013 |

(Continued)

OTHER PUBLICATIONS

English Abstract for Japanese Publication No. 2907620 B2, published Jun. 21, 1999, 2 pgs.

(Continued)

*Primary Examiner* — Jason Berman

(74) *Attorney, Agent, or Firm* — Fredrikson & Byron, P.A.

(57) ABSTRACT

The invention provides a sputter deposition assembly that includes a sputtering chamber, a sputtering target, and a magnet assembly. The magnet assembly includes a two-part magnetic backing plate that includes first and second plate segments, of which at least one is laterally adjustable. Also provided are methods of operating the sputter deposition assembly.

19 Claims, 10 Drawing Sheets

(56) References Cited

U.S. PATENT DOCUMENTS

| | | |
|---|---|---|
| 7,678,240 B2 | 3/2010 | Krassnitzer |
| 8,273,221 B2 | 9/2012 | Schneider et al. |
| 8,685,214 B1 | 4/2014 | Moh et al. |
| 8,951,394 B2 | 2/2015 | Bernick et al. |
| 2006/0065525 A1* | 3/2006 | Weichart ............. C23C 14/35 204/298.28 |
| 2009/0200158 A1 | 8/2009 | Ehiasarian |
| 2009/0205949 A1 | 8/2009 | Zueger |
| 2009/0229970 A1 | 9/2009 | Itagaki et al. |
| 2009/0229977 A1 | 9/2009 | Kondo et al. |
| 2009/0242396 A1* | 10/2009 | Brcka ............. H01J 37/3405 204/298.16 |
| 2009/0277779 A1 | 11/2009 | Sasaki |
| 2010/0006424 A1 | 1/2010 | Chung et al. |
| 2011/0079509 A1 | 4/2011 | Morohashi |
| 2013/0180851 A1 | 7/2013 | Kong et al. |
| 2013/0299349 A1 | 11/2013 | Kuriyama et al. |
| 2014/0054168 A1 | 2/2014 | German et al. |
| 2014/0158523 A1 | 6/2014 | Newcomb |
| 2015/0075970 A1 | 3/2015 | Miller |
| 2015/0194294 A1 | 7/2015 | Bernick et al. |
| 2017/0372880 A1 | 12/2017 | Hartig |

FOREIGN PATENT DOCUMENTS

| | | |
|---|---|---|
| JP | 2907620 B2 | 6/1999 |
| JP | 2012077360 A | 4/2012 |

OTHER PUBLICATIONS

PCT International Search Report and Written Opinion dated Aug. 21, 2017 from related International Application No. PCT/US2017/034197, 14 pgs.

International Patent Application No. PCT/US2017/034190, International Search Report and Written Opinion dated Aug. 25, 2017, 12 pages.

U.S. Appl. No. 15/193,484, Non-Final Office Action dated Dec. 27, 2017, 16 pages.

U.S. Appl. No. 15/193,484, Amendment and Response to Non-Final Office Action filed Mar. 27, 2018, 18 pages.

U.S. Appl. No. 15/193,484, Applicant Initiated Interview Summary dated Mar. 28, 2018, 3 pages.

U.S. Appl. No. 15/193,484, Applicant Summary of Interview with Examiner filed Mar. 27, 2018, 3 pages.

U.S. Appl. No. 15/193,484, Notice of Allowance dated May 10, 2018, 10 pages.

\* cited by examiner

FIG. 6
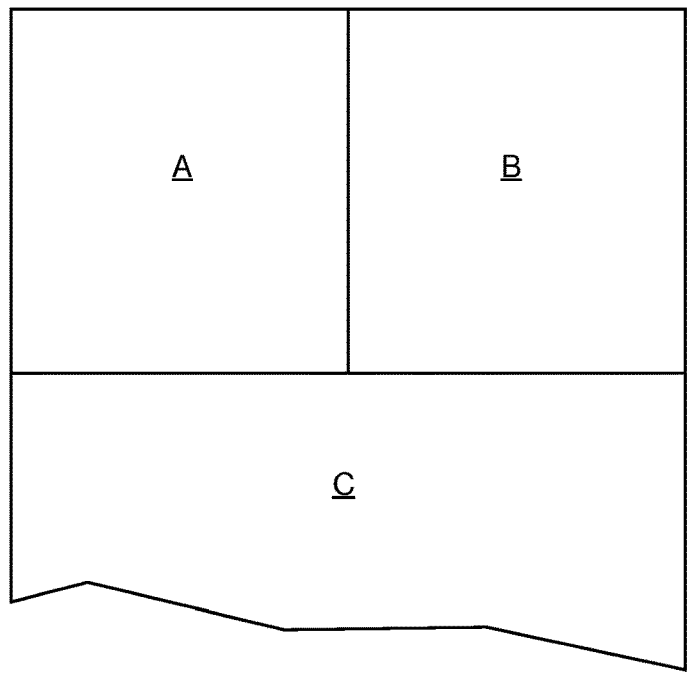
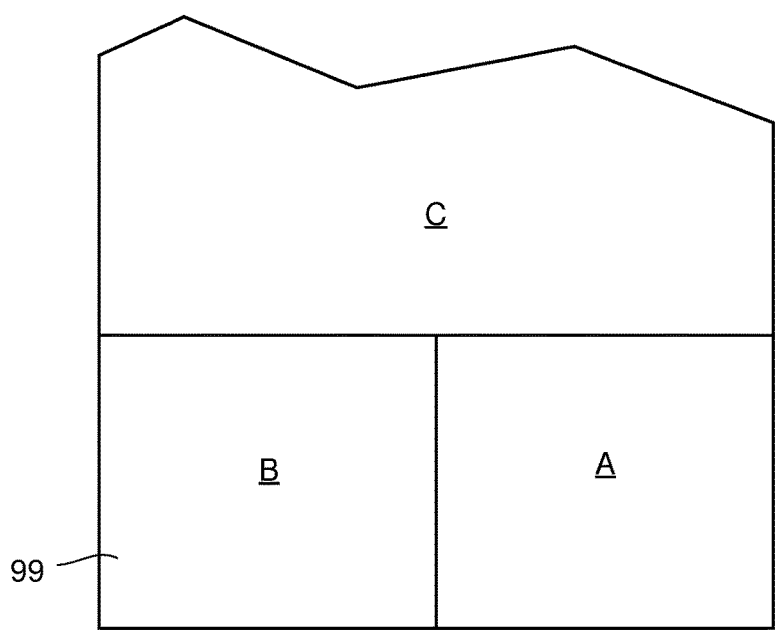

LATERALLY ADJUSTABLE RETURN PATH MAGNET ASSEMBLY AND METHODS

FIELD OF THE INVENTION

The present invention relates to methods and equipment for depositing thin film coatings onto glass and other substrates. In particular, this invention relates to methods and equipment for sputter depositing such coatings.

BACKGROUND OF THE INVENTION

Glass sheets and other substrates can be coated with many different thin film materials. Sputter deposition (or "sputtering") is one method of depositing such coatings. Sputtering is advantageous in that it can deposit a wide variety of different film materials at well controlled thicknesses. Film uniformity, however, is sometimes adversely impacted by the limitations of conventional sputter deposition equipment and process control. For example, various process phenomena, such as the so-called "cross-corner effect," can negatively impact film uniformity. Also, over the course of a production run, process conditions can change (or "drift"), causing uniformity problems. More generally, with conventional hardware and process control, the deposition rate can vary significantly at different points on the substrate due to local process conditions differing at various points on the sputtering target.

It would be desirable to provide sputter deposition equipment that is locally adjustable so as to compensate for differences in local process conditions across a sputtering target. It would be particularly desirable to provide equipment of this nature that is locally adjustable without having to move an entire magnet assembly relative to the sputtering target. Further, it would be desirable to provide sputter deposition methods wherein process conditions are adjusted locally. It would be particularly desirable to provide methods of this nature that involve adjusting the process conditions locally without moving an entire magnet assembly relative to the sputtering target.

BRIEF DESCRIPTION OF THE DRAWINGS

FIG. 6 is a schematic front view of various zones of the sputtering target of FIG. 5.

SUMMARY

Figure 1:
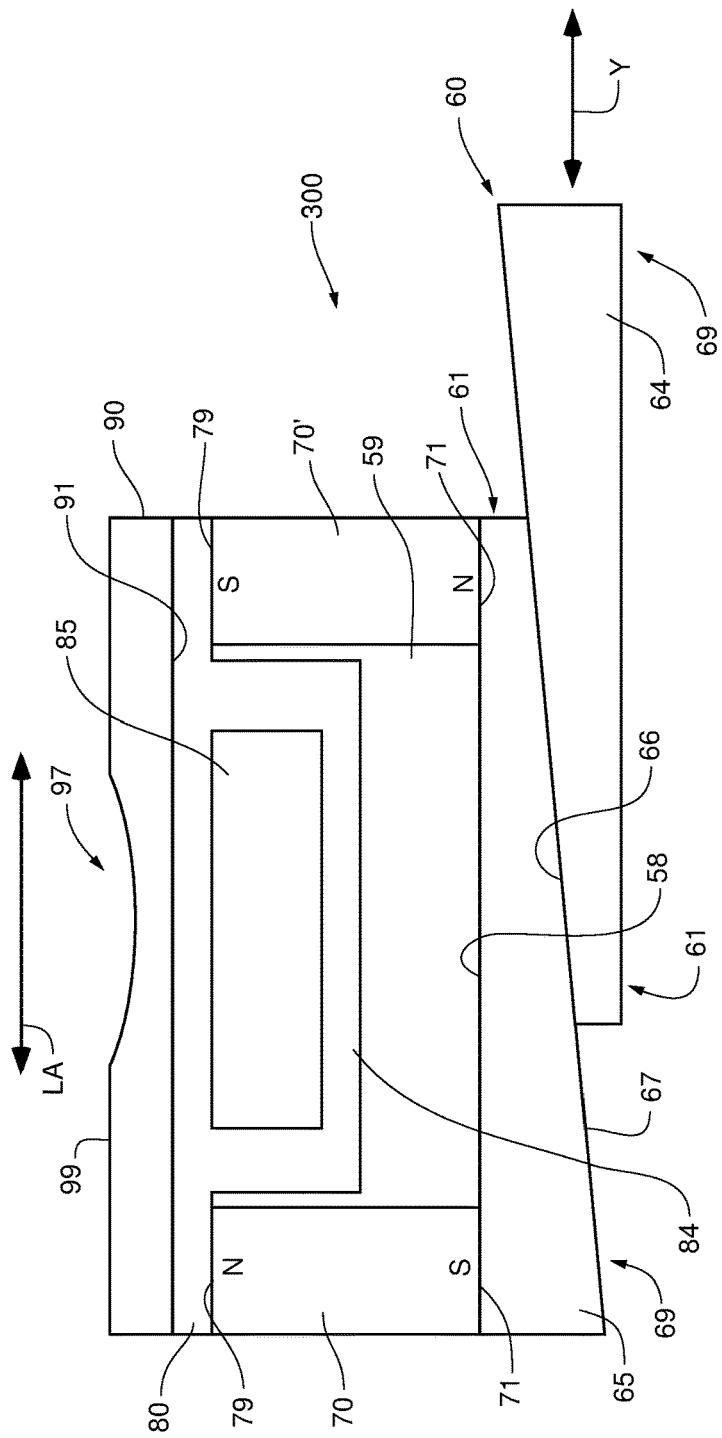
FIG. 1 is a schematic cross-sectional end view of a sputter deposition assembly including a planar sputtering target and an adjustable return path magnet assembly in accordance with an embodiment of the present invention, wherein two tapered wedge plates of the magnet assembly are shown in one configuration.

In some embodiments, the invention provides a sputter deposition assembly comprising a sputtering chamber, a sputtering target, and a magnet assembly. The magnet assembly is mounted adjacent to a rear surface of the sputtering target. The magnet assembly includes a magnetic backing plate and spaced-apart first and second permanent magnets. The first and second permanent magnets each have a proximal end and a distal end. The distal end is further from the sputtering target than is the proximal end. The magnet assembly creates a magnetic field comprising field lines that extend from the proximal end of the first magnet, through the sputtering target, along an arc located in front of the sputtering target, back through the sputtering target, to the proximal end of the second permanent magnet, through the second permanent magnet, along a return path, and to the distal end of the first permanent magnet. The return path passes through the magnetic backing plate of the magnet assembly. The magnetic backing plate includes two tapered wedge plates. The two tapered wedge plates are movable selectively toward or away from each other, such that when the two tapered wedge plates move toward each other a composite thickness of the magnetic backing plate increases, whereas when the two tapered wedge plates move away from each other the composite thickness of the magnetic backing plate decreases.

In some embodiments, the invention provides a sputter deposition assembly comprising a sputtering chamber, a sputtering target, and a magnet assembly. The magnet assembly is mounted adjacent to a rear surface of the sputtering target. The magnet assembly includes a magnetic backing plate and spaced-apart first and second permanent magnets. The first and second permanent magnets preferably are formed of hard magnetic material. The first and second permanent magnets each have a proximal end and a distal end. The distal end is further from the sputtering target than is the proximal end. The magnet assembly creates a magnetic field comprising field lines that extend from the proximal end of the first magnet, through the sputtering target, along an arc located in front of the sputtering target, back through the sputtering target, to the proximal end of the second permanent magnet, through the second permanent magnet, along a return path, and to the distal end of the first permanent magnet. The return path passes through the magnetic backing plate of the magnet assembly. The magnetic backing plate includes first and second plate segments. The first plate segment has a first channel, and the second plate segment has a first tongue. The first and second plate segments are moveable selectively toward or away from each other, such that the first tongue moves further into the first channel in response to movement of the first and second plate segments toward each other, whereas the first tongue retracts away from the first channel in response to movement of the first and second plate segments away from each other.

DETAILED DESCRIPTION

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

The present invention provides an adjustable sputter deposition system. The system offers exceptional performance in terms of its ability to achieve uniform film deposition in a wide variety of sputter deposition processes. For example, by providing an adjustable return path magnet assembly, it is possible to compensate for various process phenomena that may otherwise negatively impact the uniformity of the resulting film. In addition, the adjustability of the present magnet assembly can be used to address various process drift situations. Preferably, the system can be adjusted locally without needing to move the primary magnets of the magnet assembly (or the entire magnet assembly) closer to or further from the sputtering target.

Figure 5:
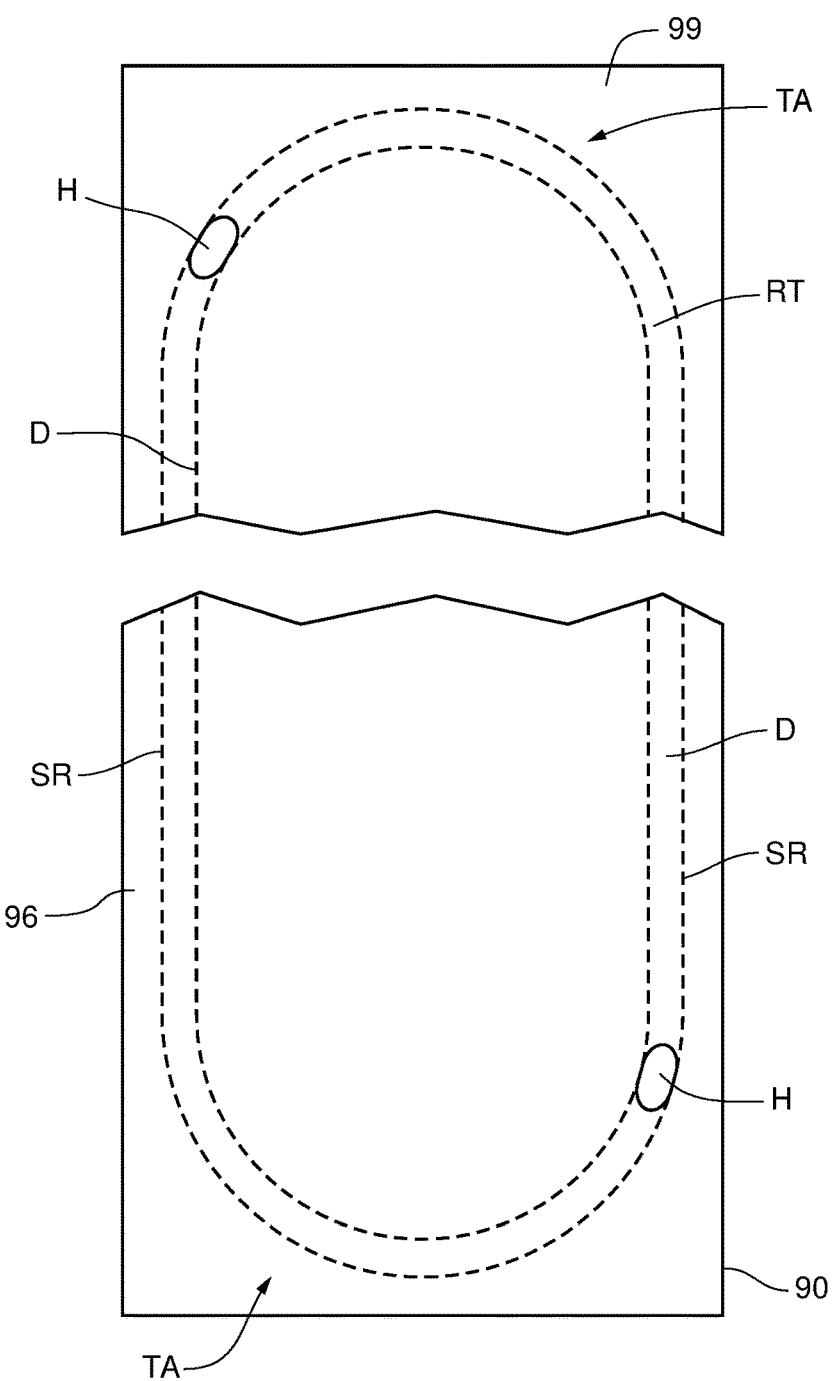
FIG. 5 is a schematic front view of a sputter deposition assembly that includes a planar sputtering target and an adjustable magnet assembly in accordance with certain embodiments of the invention.

The invention provides a sputter deposition assembly 100 that includes a sputtering chamber 200, a sputtering target 90, and a magnet assembly 300. The magnet assembly 300 is mounted adjacent to a rear surface 91 of the target 90. The magnet assembly 300 includes a plurality of primary magnets 70, 70' that generate a magnetic field (e.g., a magnetron magnetic field) 150. Preferably, the magnet assembly 300 is configured in a racetrack arrangement RT that includes: (i) two generally parallel elongated side regions SR, and (ii) two curved turnaround regions TA at opposite ends of the racetrack arrangement. Reference is made to FIG. 5.

Figure 9:
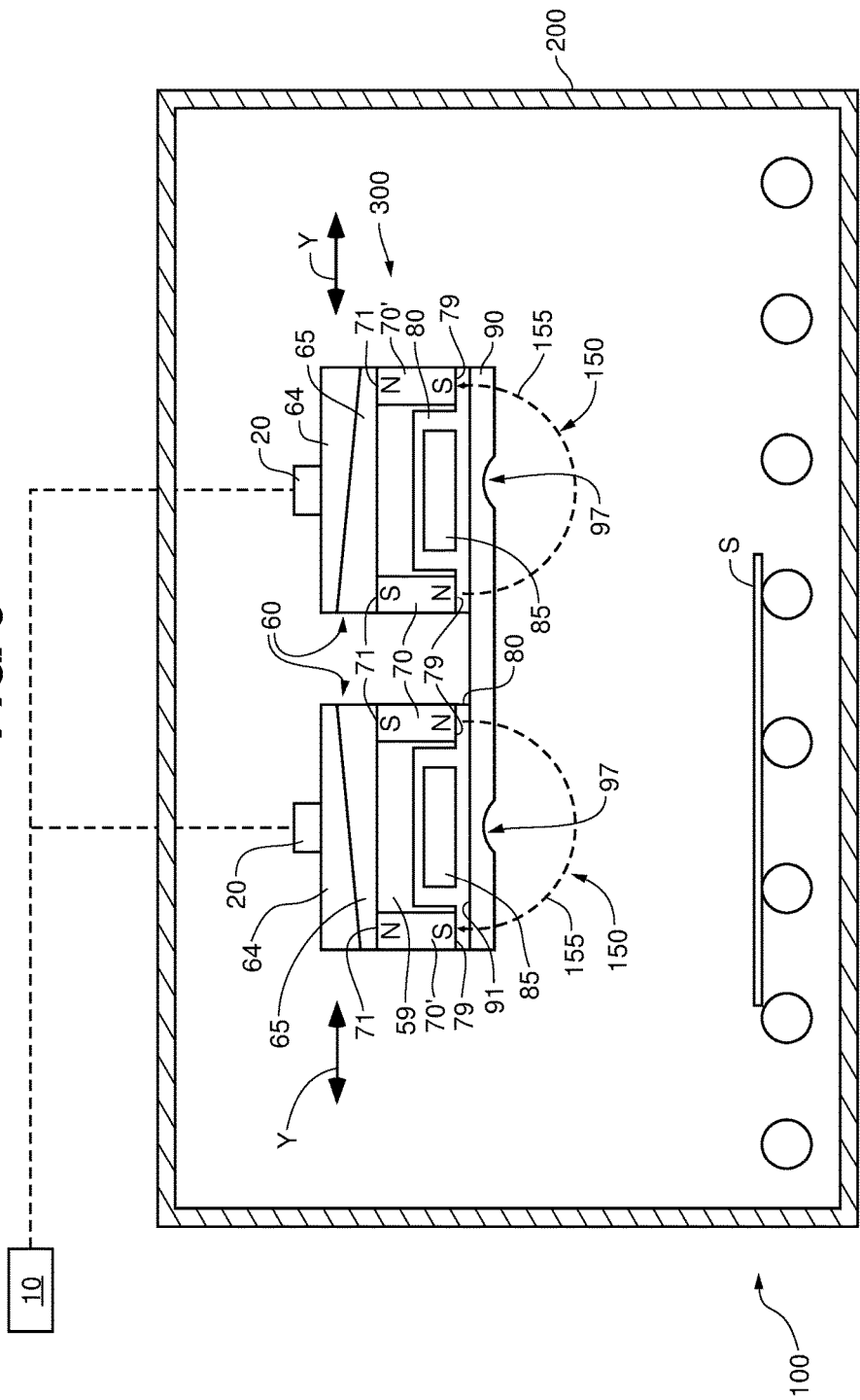
FIG. 9 is a schematic cross-sectional side view of a sputter deposition assembly including a sputtering chamber, a sputtering target, and an adjustable magnet assembly in accordance with certain embodiments of the invention.

The magnet assembly 300 includes a magnetic backing plate 60 and laterally spaced-apart first and second permanent magnets 70, 70'. The first and second permanent magnets 70, 70' each have a proximal end 79 and a distal end 71. The distal end 71 is further from the adjacent rear surface 91 of the sputtering target 90 than is the proximal end 79. The magnet assembly 300 creates a magnetic field 150 comprising field lines 155 that extend from the proximal end 79 of the first magnet 70, through the sputtering target 90, along an arc located in front of the sputtering target, back through the sputtering target, to the proximal end 79 of the second permanent magnet 70', through the second permanent magnet, along a return path, and to the distal end 71 of the first permanent magnet 70. This is best appreciated by referring to FIG. 9. The return path passes through the magnetic backing plate 60. As shown in FIG. 9, the magnetic field in front of the sputtering target includes a component that is parallel (or at least substantially parallel) to the adjacent front surface 99 of the sputtering target 90.

Figure 2:
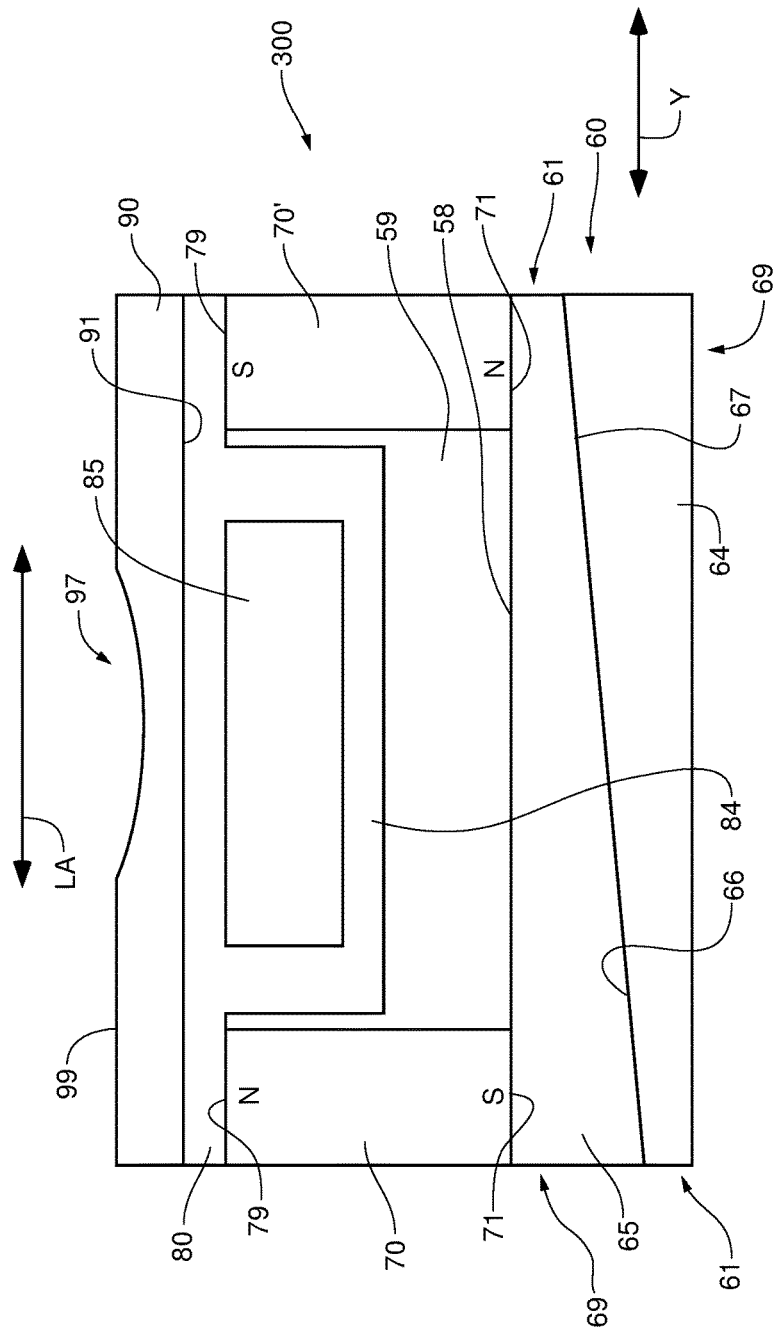
FIG. 2 is a schematic cross-sectional end view of the sputter deposition assembly of FIG. 1, wherein the two tapered wedge plates of the magnet assembly are shown in another configuration.

The magnetic backing plate 60 preferably extends between the first 70 and second 70' permanent magnets. In the embodiment of FIGS. 1 and 2, the magnetic backing plate 60 extends continuously and entirely between the two permanent magnets 70, 70'. Here, the illustrated backing plate 60 is parallel (or at least substantially parallel) to the adjacent rear surface 91 of the target 90. In the embodiments illustrated, the magnetic backing plate 60 is in contact with both permanent magnets 70, 70'. This, however, is not required.

In the embodiment of FIGS. 1 and 2, the magnetic backing plate 60 comprises two tapered wedge plates 64, 65. The two wedge plates 64, 65 are movable selectively toward or away from each other (e.g., parallel to lateral axis LA), such that when the two wedge plates move toward each other, a composite thickness of the magnetic backing plate 60 increases, whereas when the two wedge plates move away from each other, the composite thickness of the magnetic backing plate decreases. This can be appreciated by comparing FIG. 1 with FIG. 2; the composite thickness of the magnetic backing plate 60 is greater when in the configuration of FIG. 2 than when in the configuration of FIG. 1. In addition, the total lateral width (measured along the lateral axis LA) of the magnetic backing plate 60 is greater when in the configuration of FIG. 1 than when in the configuration of FIG. 2.

In the embodiment of FIGS. 1 and 2, the sputter deposition assembly 100 is configured such that the magnetic field 150 (e.g., a component thereof parallel to the adjacent front surface of the target, and/or one or more regions thereof) located in front of the sputtering target 90 changes in strength, configuration, or both in response to movement of the two tapered wedge plates 64, 65 selectively toward or away from each other. Preferably, a component of the magnetic field parallel (or at least substantially parallel) to the adjacent front surface of the target changes in strength in response to movement of the two wedge plates selectively toward or away from each other. In some cases, this involves a first 64 of the two wedge plates moving relative to a stationary, second 65 of the two wedge plates. In other cases, both of the wedge plates simultaneously move toward or away from each other. Thus, the magnet assembly 300 preferably is mounted adjacent to the rear surface 91 of the target 90 such that at least one of the two wedge plates 64, 65 is movable laterally relative to the other of the two wedge plates.

In more detail, movement of the two tapered wedge plates 64, 65 toward or away from each other may involve one or both of the two tapered wedge plates moving parallel to the path of substrate travel. This can be appreciated by referring to FIG. 9.

The two tapered wedge plates 64, 65 preferably have a sliding interface with each other. Each of the tapered wedge plates 64, 65 shown in FIGS. 1 and 2 has a slanted camming surface 66, 67. Here, the slanted camming surfaces 66, 67 of the two wedge plates 64, 65 are carried alongside each other, preferably such that the two slanted camming surfaces slide against each other in response to the two wedge plates moving (e.g., laterally) toward or away from each other.

In some embodiments, a first 64 of the two wedge plates 64, 65 is mounted so as to be movable selectively toward or away from a second 65 of the two wedge plates, whereas the second of the two wedge plates is mounted in a fixed position relative to the two permanent magnets 70, 70'. This can be appreciated by comparing FIG. 1 with FIG. 2. Here, the second wedge plate 65 has opposed first and second side end regions (e.g., lateral side end regions), the first side end region of the second wedge plate 65 is mounted against (and has a fixed interface with) the distal end 71 of the first permanent magnet 70, and the second side end region of said second wedge plate 65 is mounted against (and has a fixed interface with) the distal end 71 of the second permanent magnet 70'. In this embodiment, the two permanent magnets 70, 70' and the second wedge plate 65 are mounted in fixed positions and preferably remain stationary during operation, including during adjustment of the moveable wedge plate 64. Thus, there preferably is a sliding interface between the two wedge plates 64, 65 shown in FIGS. 1 and 2. In more detail, the embodiment illustrated in FIGS. 1 and 2 involves one 65 of the two wedge plates 64, 65 being mounted in a fixed position relative to the two permanent magnets 70, 70', while the other 64 of the two wedge plates 64, 65 is mounted so as to be laterally moveable relative to the fixed wedge plate 65.

With continued reference to FIGS. 1 and 2, the illustrated magnetic backing plate 60 has first and second configurations. The first configuration is characterized by the two tapered wedge plates 64, 65 being carried alongside each other such that the first side ends (e.g., first lateral side ends) of the two tapered wedge plates are flush (or at least substantially flush) with each other, while the second side ends (e.g., second lateral side ends) of the two tapered wedge plates are flush (or at least substantially flush) with each other. Reference is made to FIG. 2. Here, the first lateral side ends of the two tapered wedge plates 64, 65 are flush (or at least substantially flush) with the lateral exterior side of first permanent magnet 70, and the second lateral side ends of the two tapered wedge plates 64, 65 are flush (or at least substantially flush) with the lateral exterior side of second permanent magnet 70'. It is to be appreciated, however, that these details are by no means required. The second configuration is characterized by the two tapered wedge plates 64, 65 being carried alongside each other such that the first side ends of the two wedge plates are laterally spaced apart from each other, while the second side ends of the two wedge plates are laterally spaced apart from each other. Reference is made to FIG. 1. The composite thickness of the magnetic backing plate 60 is greater when in the first configuration than when in the second configuration.

It is to be appreciated that the first configuration need not always involve the lateral side ends of the two wedge plates being flush with each other. Instead, the second configuration may simply involve the first side ends of the two wedge plates being spaced further apart laterally from each other when in the second configuration than in the first configuration, and the second side ends of the two wedge plates being spaced further apart laterally from each other when in the second configuration than in the first configuration. Again, it can be appreciated that the composite thickness of the magnetic backing plate 60 is greater when in the first configuration than when in the second configuration.

Further, in some embodiments, to obtain the minimum H field, the first wedge plate 64 can be moved (and thus is moveable) even further away laterally from the second wedge plate 65 (i.e., even further to the right as seen in FIG. 1, as compared with the configuration shown in FIG. 1). The resulting configuration of the two wedge plates 64, 65 can be referred to as the minimum-H-field configuration. In contrast, to obtain the maximum H field, two illustrated tapered wedge plates 64, 65 of the illustrated type can be positioned in the configuration shown in FIG. 2. That configuration of the two wedge plates 64, 65 can be referred to as the maximum-H-field configuration.

Thus, it is possible to adjust the magnetic field 150 above the sputtering target 90 without having to physically move the permanent magnets 70, 70' (or the whole magnet assembly 300) closer to or further from the adjacent rear surface 91 of the target. This makes it possible to avoid large, complicated, and/or less reliable systems that may otherwise be used to move the permanent magnets 70, 70' (or the whole magnet assembly 300) toward or away from the target. In the present embodiments, the system preferably is configured and operated such that the magnetic field 150 in front of the target 90 (e.g., the strength of a component thereof parallel to the adjacent front surface of the target) can be adjusted without having to move (and is adjusted without moving) any permanent magnet 70, 70' toward or away from the adjacent rear surface 91 of the target.

In more detail, the embodiment of FIGS. 1 and 2 is configured and operated such that the strength of a component of the magnetic field 150 parallel to the adjacent front surface of the target: (i) increases in response to lateral movement of the first wedge plate 64 toward the second wedge plate 65 (which involves the two slanted camming surfaces 66, 67 sliding against each other so as to increase the composite thickness of the magnetic backing plate 60), and (ii) decreases in response to lateral movement of the first wedge plate 64 away from the second wedge plate 65 (which involves the two slanted camming surfaces 66, 67 sliding against each other so as to decrease the composite thickness of the magnetic backing plate 60). As will be appreciated, when the strength of the component of the magnetic field 150 parallel to the adjacent front surface of the target increases, the local sputtering rate increases, and when the strength of the component of the magnetic field 150 parallel to the adjacent front surface of the target decreases, the local sputtering rate decreases.

In the embodiment of FIGS. 1 and 2, the two tapered wedge plates 64, 65 have substantially the same width (measured along the lateral axis LA), although this may not be the case in all embodiments.

Preferably, neither of the two tapered wedge plates 64, 65 is a permanent magnet. Instead, the wedge plates 64, 65 preferably are each formed of soft magnetic material, such as ferromagnetic or ferrimagnetic material. In certain embodiments, the magnet assembly 300 is devoid of any movably-mounted permanent magnets located directly between the two spaced-apart magnets 70, 70'. In some cases, the magnet assembly 300 is devoid of any movably-mounted or fixedly-mounted permanent magnets located directly between the two spaced-apart magnets 70, 70'. Additionally or alternatively, the magnet assembly 300 can optionally be devoid of any movably-mounted magnetic (e.g., ferromagnetic or ferrimagnetic) bodies, such as shunts, located directly between the two spaced-apart magnets 70, 70'.

In one embodiment, movement of wedge plate 64 is facilitated like the movement of a piston in an engine. A stepper motor drives a crank, which is connected to the mobile wedge plate 64 by a connection rod. The connection rod connects the crank mounted to the fixed wedge plate 65 and the mobile wedge plate 64. The rod can, for example, be connected by ball joint links to allow for the small climb of the mobile lower wedge 64 (referring to the embodiment of FIGS. 1-2 when used in the orientation shown in those figures).

In another embodiment, a spindle/worm drive is used to move the illustrated mobile wedge plate 64 relative to the illustrated stationary wedge 65. Thus, a threaded connecting rod is attached to the wedge plates by nuts that have the possibility to tilt slightly up and down to allow for the lower wedge plate 64 (again, referring to the embodiment of FIGS. 1-2 when used in the orientation shown in those figures) to move slightly up or down while sliding up or down the stationary upper wedge plate 65. Given the present teaching as a guide, it will be apparent to skilled artisans that many other arrangements are also possible to accomplish lateral sliding of the wedge plates 64, 65.

To reduce friction between the wedge plates 64, 65 of magnetic material, e.g., to prevent or minimize the camming surfaces 66, 67 from sticking together, these surfaces 66, 67 can optionally be treated with a dry lubricant (e.g., one or both surfaces 66, 67 may have a dry lubricant coating). In other cases, the relative movement of a mobile wedge plate 64 along a stationary wedge plate 65 may be facilitated by embedded bearing balls in one or both surfaces 66, 67 so as to create a very small gap between the coupled wedge plates 64, 65.

Figure 3:
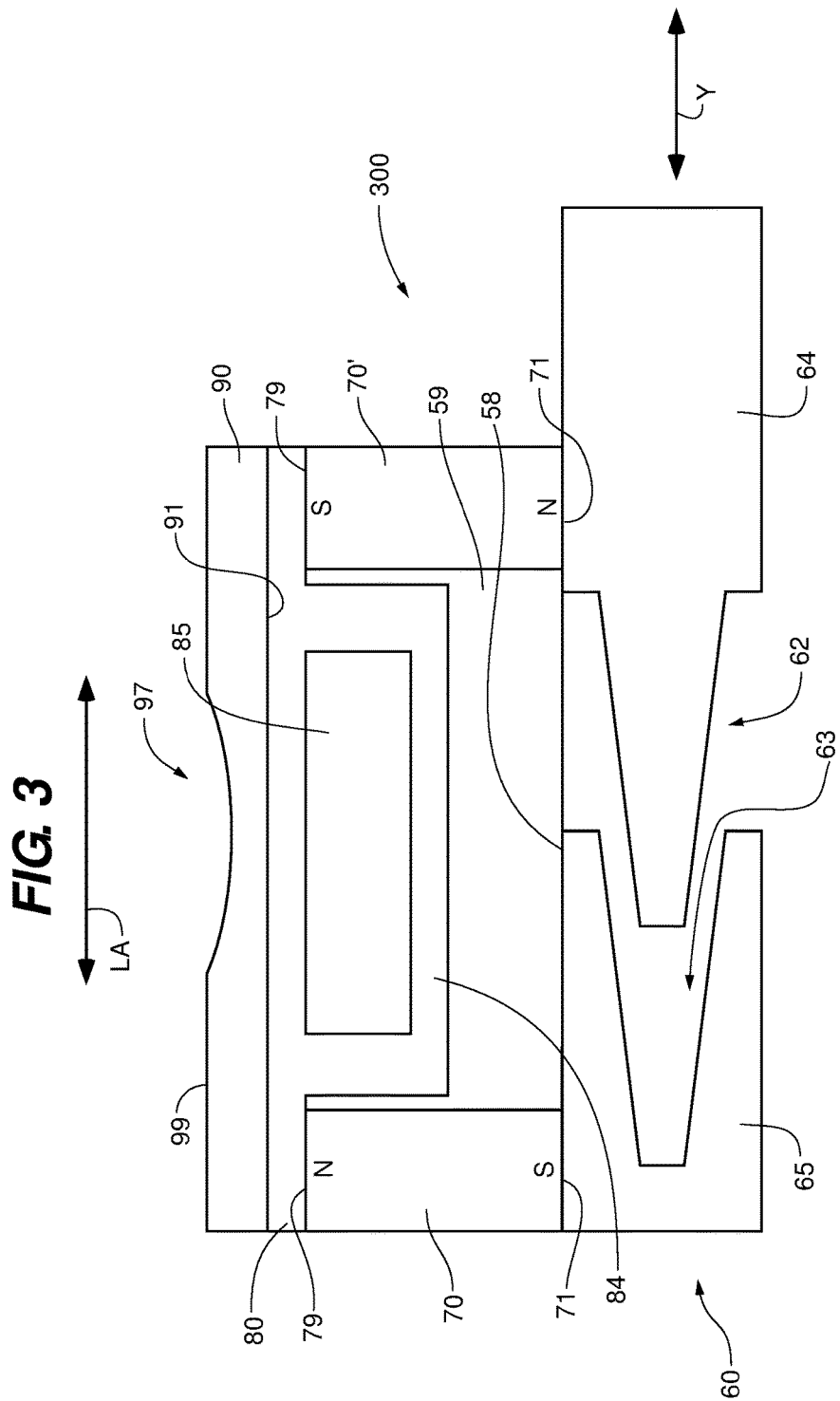
FIG. 3 is a schematic cross-sectional end view of a sputter deposition assembly including a planar sputtering target and an adjustable return path magnet assembly in accordance with another embodiment of the invention.
Figure 4:
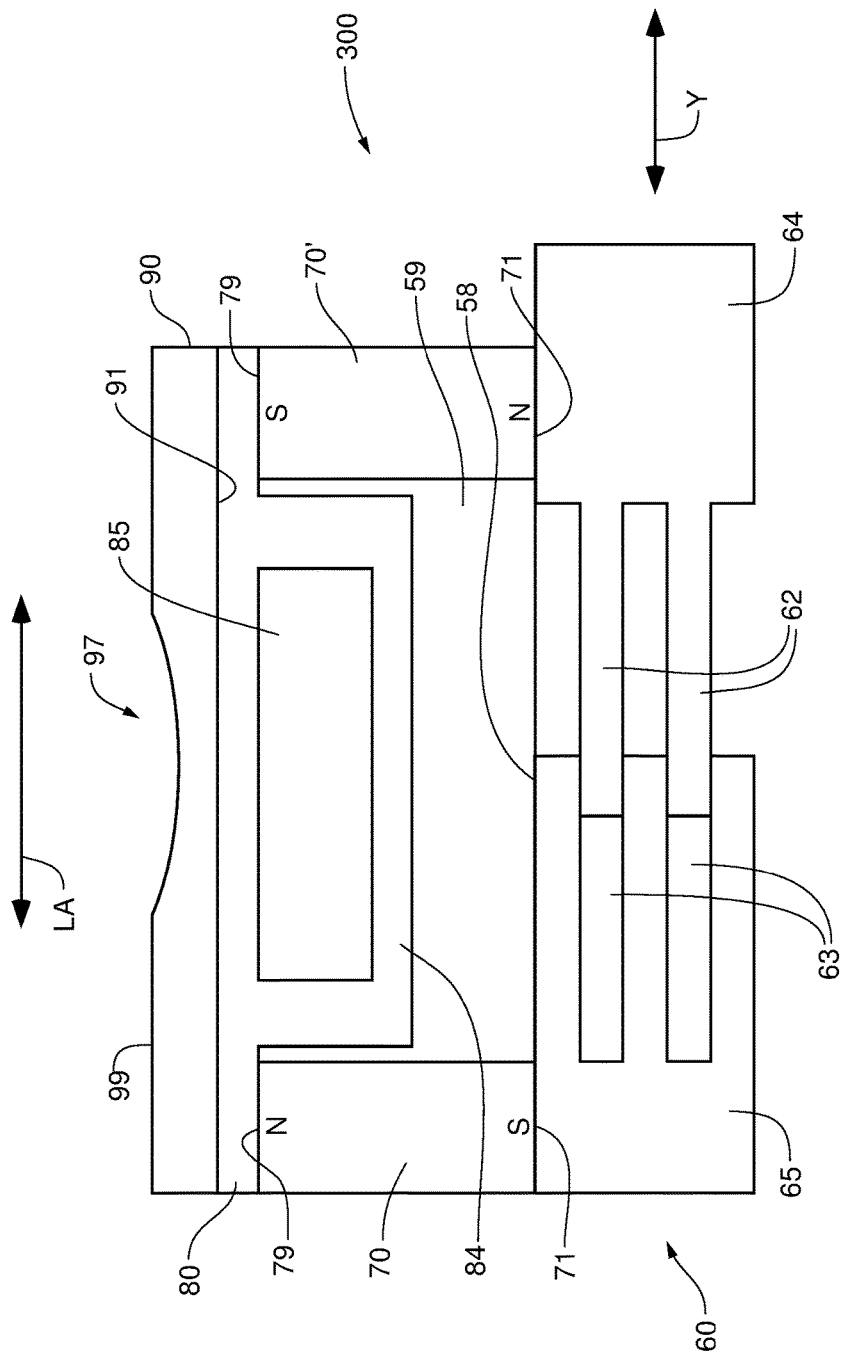
FIG. 4 is a schematic cross-sectional end view of a sputter deposition assembly including a planar sputtering target and an adjustable return path magnet assembly in accordance with still another embodiment of the invention.

Thus, the magnetic backing plate 60 can comprise first and second plate segments 64, 65. In any embodiment of the present disclosure, the magnetic backing plate 60 can advantageously be a two-part magnetic backing plate comprising two plate segments 64, 65 at least one of which is laterally adjustable. In the embodiments of FIGS. 3 and 4, one of the two plate segments 64, 65 includes a tongue 62, while the other includes a channel 63. In the embodiments illustrated, the first plate segment 64 includes a tongue 62, and the second plate segment 65 includes a channel 63. It is to be appreciated, however, that the first plate segment 64 can alternatively have a channel while the second plate segment 65 has a tongue.

The first and second plate segments 64, 65 are laterally moveable selectively toward or away from each other. In the embodiment of FIG. 3, the tongue 62 moves into, or further into, the channel 63 in response to movement of the first and second plate segments 64, 65 laterally toward each other, whereas the tongue 62 retracts away from the channel 63 in response to movement of the first and second plate segments 64, 65 laterally away from each other.

In the embodiments of FIGS. 3 and 4, the sputter deposition assembly is configured such that the magnetic field 150 (e.g., a component thereof parallel to the adjacent front surface of the target, and/or one or more regions thereof) located in front of the sputtering target 90 changes in strength, configuration, or both in response to movement of the first and second plate segments 64, 65 selectively toward or away from each other. Preferably, a component of the magnetic field parallel (or at least substantially parallel) to the adjacent front surface of the target changes in strength in response to lateral movement of the two plate segments 64, 65 selectively toward or away from each other. In some cases, this involves a first 64 of the two plate segments 64, 65 moving laterally relative to a stationary, second 65 of the two plate segments. In other cases, both of the plate segments simultaneously move laterally toward or away from each other. Thus, the magnet assembly 300 preferably is mounted adjacent to the rear surface 91 of the target 90 such that at least one of the two plate segments 64, 65 is movable laterally relative to the other. In the embodiments illustrated in FIGS. 3 and 4, one 65 of the two plate segments 64, 65 is mounted in a fixed position relative to the two permanent magnets 70, 70', while the other 64 of the two plate segments 64, 65 is mounted so as to be laterally moveable relative to the fixed plate segment 65.

In embodiments like those exemplified by FIGS. 3 and 4, the magnet assembly 300 is mounted adjacent to the rear surface 91 of the sputtering target 90 such that one or both of the first and second plate segments 64, 65 are movable laterally relative to the two permanent magnets 70, 70'. As noted above, the illustrated first plate segment 64 is mounted so as to be laterally movable selectively toward or away from the second plate segment 65, and the illustrated second plate segment 65 is mounted in a fixed position relative to the two permanent magnets 70, 70'. Here, the illustrated fixed plate segment 65 is mounted fixedly against the distal end 71 of the first permanent magnet 70, and the illustrated laterally moveable plate segment 64 has a sliding interface with the distal end 71 of the stationary second permanent magnet 70'. This, however, is not required. For example, a shunt or the like may be positioned between the first plate segment and second permanent magnet, between the second plate segment and the first permanent magnet, or both.

In the embodiment of FIG. 3, the illustrated tongue 62 has a leading end and a base end, and this tongue has a tapered configuration such that it becomes increasingly narrow in moving from the base end to the leading end. In addition, the illustrated channel 63 has an open end and a closed end (or "blind end"), and this channel has a tapered configuration such that it becomes increasingly narrow in moving from the open end to the closed end. Preferably, the tongue 62 and channel 63 have complementary configurations such that when the tongue is fully inserted into the channel, there is no remaining pocket of empty space (or at least substantially no remaining pocket of empty space) therebetween. It is to be appreciated that the tongue can be provided in different shapes. For example, it need not be tapered. Instead, a rectangular tongue may be provided.

Preferably, neither of the first and second plate segments 64, 65 is a permanent magnet. Instead, the first and second plate segments 64, 65 preferably are each formed of soft magnetic material, such as ferromagnetic or ferrimagnetic material.

With continued reference to FIGS. 3 and 4, each illustrated magnetic backing plate 60 has first and second configurations. In the embodiments illustrated in FIGS. 3 and 4, the first configuration is characterized by the two plate segments 64, 65 being positioned such that each tongue 62 is fully inserted (e.g., bottomed-out) in its respective channel 63, preferably such that each channel is filled entirely by its respective tongue. In such cases, there may be no pocket of space (or at least substantially no pocket of space) remaining between the two plate segments 64, 65. The second configuration is characterized by the two plate segments 64, 65 being positioned such that the leading end of each tongue is spaced apart from the bottom end of its respective channel. In other embodiments, the second configuration can be characterized by the leading end of each tongue being spaced further apart from the bottom end of its respective channel when in the second configuration than when in the first configuration.

In the embodiment of FIG. 4, the first plate segment 64 includes first and second tongues 62, and the second plate segment 65 includes first and second channels 63. Here, the sputter deposition assembly is configured and operated such that the first and second tongues 62 move respectively into (or further into) the first and second channels 63 in response to lateral movement of the first and second plate segments 64, 65 toward each other, whereas the first and second tongues 62 retract respectively away from the first and second channels 63 in response to lateral movement of the first and second plate segments 64, 65 away from each other. In other embodiments, the two channels can be on the first plate segment 64, while the two tongues are on the second plate segment 65. In still other embodiments, the first plate segment 64 can include both a first tongue and a first recess, while the second plate segment 65 includes both a second tongue (aligned with the first recess) and a second recess (aligned with the first tongue). Further variants of this nature will be apparent to skilled artisans given the present teaching as a guide.

Each moveable plate segment can optionally be coupled to a motor 20 configured to move such plate segment(s) laterally. Thus, in certain embodiments, each moveable plate segment is adapted to move laterally between first and second positions in response to operation of a motor. Moreover, in certain embodiments, the system includes a control unit 10 operably connected with each motor 20. When provided, the control unit 10 preferably is located at a position external to the sputtering chamber 200, whereby an operator can initiate lateral movement of one or more desired (optionally all of the) plate segments from outside the sputtering chamber 200 without having to open the chamber, stop sputtering the target 90, or both. The foregoing optional motor and control unit details can be provided with the type of magnetic backing plate 60 shown in FIGS. 1 and 2, or with the type of magnetic backing plate 60 shown in FIGS. 3 and 4.

In some embodiments, to get signals and power inside the sputtering chamber 200 (vacuum) and inside the cathode body, a programmable computer is set-up outside the coater. The computer is programmed to run a program addressing the individual motors inside, with feedback to indicate the current location of the movable plate segments (which preferably are moveable shunts). The motors can optionally be stepper motors, and the system may be set up to count forward and backward steps. The power to step the motors can optionally be fed into the cathode from a power-source outside the coater, similar to the cathode cooling water. Sealing to atmosphere can be done by multiple pin high vacuum capable feedthroughs. The interface (computer/motor) used to direct the stepping signals can optionally be outside the coater, e.g., permanently attached to the top lid, which carries the installations supplying and controlling the cathode. The motors are located inside the internal vacuum of the cathode. To protect them from overheating, they can optionally be cooled using the available cooling water by heat conducting attachment. In other embodiments, only one power line and one signal line connect the control computer (outside vacuum) to the inside of the cathode. The interface to multiplex the stepping power to the addressed motor can optionally be inside the body of the cathode. In various embodiments of many such types, the inside of the cathode will be at different high voltages (against ground) during operation. In such cases, it will be appropriate to use high voltage insulation gear (insulation transformers) capable of safe transformation of the stepping power-signals and the multiplexer command signals to the motors and controls inside the cathode.

In some alternate embodiments, the moveable plate segments are not adjusted by operating motors. Instead, the adjustments are done manually, e.g., using hand-held tools to independently adjust the position of each moveable plate segment.

With reference to the different embodiments shown in FIGS. 1-4, the system preferably includes a cooling plate 80 that defines a cooling channel 85 through which water flows during sputtering. Here, the illustrated cooling plate 80 is carried alongside the rear surface 91 of the sputtering target 90, optionally such that the cooling channel 85 is located directly between the first 70 and second 70' permanent magnets. The cooling channel 85 optionally extends along the entire path of the racetrack RT.

Figure 10:
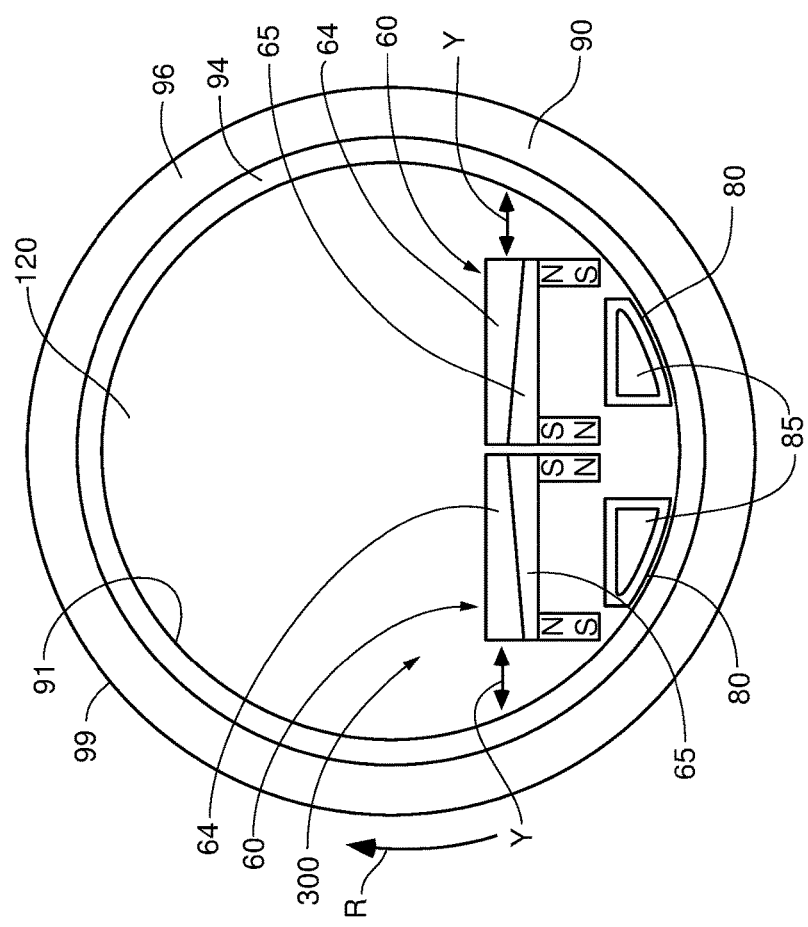
FIG. 10 is a schematic cross-sectional side view of a sputter deposition assembly including a cylindrical sputtering target and an adjustable magnet assembly in accordance with certain embodiments of the invention.

The system can involve a planar or cylindrical sputtering target. FIGS. 1-6 and 9 depict planar targets, whereas FIG. 10 depicts a cylindrical target. In many cases, the target 90 will include a support plate (or, in the case of a cylindrical target, a support tube) 94 on which a layer of sputterable material 96 is provided. It will be appreciated that many different sputterable materials can be used, depending upon the film(s) to be deposited. In one group of embodiments, the sputterable material includes both indium and tin. The sputterable material, for example, can be a metallic indium-tin compound (e.g., an alloy comprising or consisting of indium and tin). In another group of embodiments, the sputterable material includes silver. The sputterable material, for example, can consist of metallic silver or a metallic alloy comprising silver. These two groups of embodiments are notable in that the films sputtered from targets of these types would tend to derive particular benefit from exceptional uniformity control.

The foregoing examples of sputterable material options, however, are not limiting. To the contrary, the sputterable material of the present target 90 can have a wide variety of compositions, depending upon the type of film to be deposited. Other non-limiting possibilities for the sputterable material include titanium, titanium suboxide, silicon (optionally doped with a small amount of aluminum), zinc, tin, or a metallic compound of zinc and tin.

If desired, one or more intermediate layers can be provided between the optional support plate (or support tube) and the layer of sputterable material. One or more conventional adhesion layers may be beneficial, depending upon the compositions of the sputterable material and the target backing. When provided, an adhesion layer may have a coefficient of thermal expansion between that of the target backing and that of the sputterable material. Skilled artisans will be familiar with various options for such interlayers. Further, it is to be appreciated that in some embodiments, the target does not have a separate backing plate or backing tube, but rather the entire target is formed by the sputterable material itself.

In embodiments involving a cylindrical sputtering target, the magnet assembly 300 is mounted inside the target 90, i.e., within an interior space 120 bounded by the target. This is shown in FIG. 10. In such embodiments, one or more cooling fluid channels (e.g., water channels) 85 preferably are also provided inside the target 90 so as to be in thermal contact with the rear surface 91 of the target 90. When a cylindrical target is used, it is conventional to mount it rotatably to an end block of the sputter deposition system. End blocks, and the manner in which cylindrical targets are mounted rotatably to one or two end blocks, are well known to skilled artisans.

As noted above, the magnet assembly 300 is mounted adjacent to a rear surface 91 of the target 90. The opposite surface of the target, i.e., the front surface 99, is defined by the sputterable material. Thus, it is the front surface 99 of the target 90 from which sputterable material is ejected toward a substrate (e.g., a glass sheet) S during sputtering. In planar target embodiments (e.g., like those of FIGS. 1-6 and 9), an erosion trench 97 is formed in the front surface 99 of the target 90 during sputtering. As described previously, the magnetic field 150 forms a closed-loop tunnel above the target 90. Thus, when sputtering a planar target, an erosion trench 97 is formed by ion bombardment of the target. This ion bombardment results from the high density of plasma trapped by the magnetic field 150 adjacent to the front surface 99 of the target 90. The erosion trench 97 on a planar target will typically be located between (e.g., centered between) the laterally spaced-apart inner 70 and outer 70' primary magnets. When sputtering a rotating cylindrical target (e.g., of the nature shown in FIG. 10), the erosion typically creates a well-known dog-bone shape on the target.

The magnet assembly 300 preferably includes a series of magnet assembly segments 500. In embodiments of this nature, each magnet assembly segment 500 preferably includes an inner magnet 70, an outer magnet 70', and a magnetic backing plate 60. Each magnetic backing plate 60 preferably is a two-part backing plate comprising two plate segments 64, 65, at least one of which is laterally moveable. These components have been described.

Figure 7:
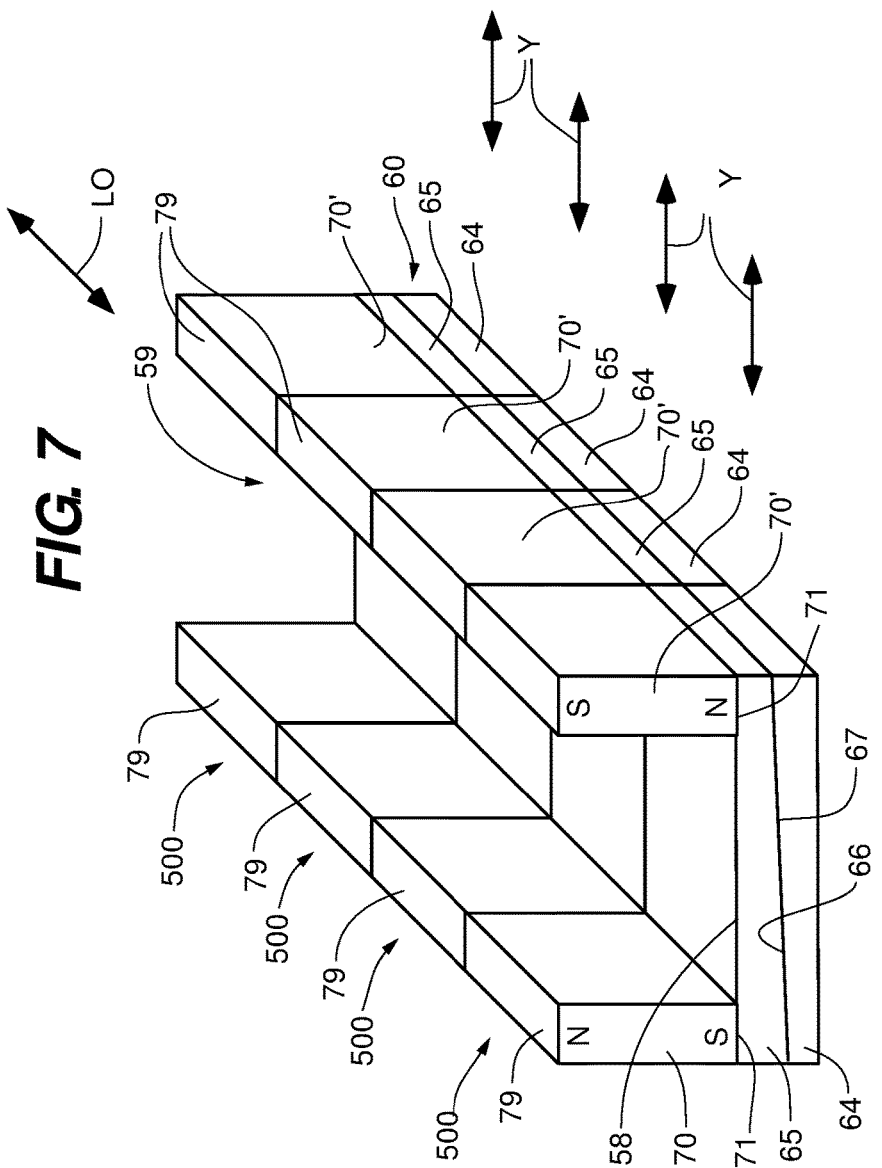
FIG. 7 is a schematic perspective view of a portion of an elongated side region of an adjustable magnet assembly in accordance with certain embodiments of the invention
Figure 8:
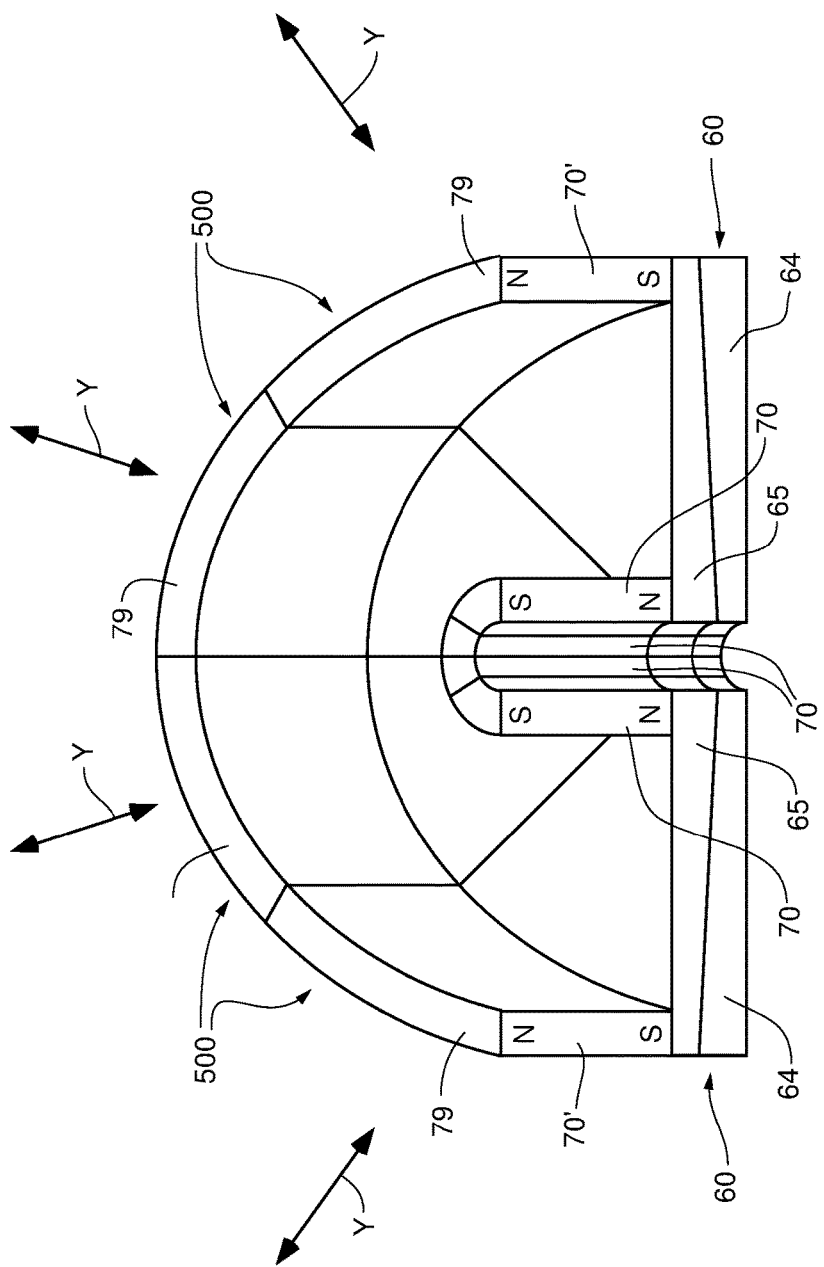
FIG. 8 is a schematic perspective view of a curved turnaround region of an adjustable magnet assembly in accordance with certain embodiments of the invention.

Preferably, the magnet assembly segments 500 are mounted end-to-end so as to collectively form the racetrack arrangement RT. Reference is made to FIGS. 5, 7, and 8. In more detail, the magnet assembly 300 preferably comprises a series of magnet assembly segments 500 aligned in an end-to-end manner so as to collectively form an elongated racetrack configuration RT that includes two parallel elongated straight regions SR and two curved turnaround regions TA. Each magnet assembly segment 500 preferably includes at least one moveable plate segment 64 that is mounted for independent lateral movement relative to the sputtering target 90. Thus, the magnet assembly 300 preferably includes a series of moveable plate segments 64 each mounted for independent lateral movement relative to the sputtering target 90. Preferably, the moveable plate segments 64 are positionable independently so that, if desired, different moveable plate segments 64 at different locations along the racetrack RT can be positioned at different lateral positions. In some embodiments, the magnet assembly 300 includes a plurality of moveable plate segments 64 located at: (i) each of the two parallel elongated straight regions SR of the elongated racetrack configuration, and (ii) each of the two curved turnaround regions TA of the elongated racetrack configuration RT. This is perhaps best appreciated by referring to FIGS. 7 and 8.

The present magnet assembly 300 is advantageous in that the magnet assembly segments 500 need not be moved (e.g., are mounted such that they are not independently moveable) in their entirety toward or away from the adjacent rear surface of the sputtering target 90 in order to locally adjust the magnetic field 150. Instead, local adjustments can be made (e.g., the strength of the component of the magnetic field parallel to the adjacent front surface of the target can be changed locally) simply by moving one or more moveable plate segments 64 of the magnet assembly segments 500, e.g., by independently moving one or more of the moveable plate segments 64 laterally relative to the magnet pair 70, 70' of the respective backing plate(s) 60 of the magnet assembly 300. The terms "local adjustment," "locally adjust," and the like as used herein refer to changing the magnetic field independently at different length segments of the racetrack. Preferably, the independently adjustable length segments collectively form the entire length of the racetrack.

The present discussion of methods focuses on embodiments wherein only the first plate segments 64 are moveable. As noted above, however, one or both plate segments 64, 65 of each magnet assembly segment 500 can be laterally moveable. Thus, any mention of one or more first plate segments 64 being laterally moveable is to be understood to also include the possibility of the second plate segment(s) 65 being laterally moveable (instead of, or in addition to, the first plate segment(s) 64 being laterally moveable).

In the embodiments illustrated, the magnet assembly 300 comprises a plurality of primary magnets, including a series of inner magnets 70 and a series of outer magnets 70'. Preferably, the outer magnets 70' all have the same field orientation and are arranged in a closed loop. Likewise, the inner magnets 70 preferably all have the same field orientation (which is opposite to that of the outer magnets) and are arranged in a closed loop. One suitable closed loop arrangement of this nature can be appreciated by referring to FIG. 5, which schematically depicts an embodiment wherein the magnet assembly 300 is configured in a racetrack arrangement RT having: (i) two generally parallel elongated side regions SR, and (ii) two curved turnaround regions TA at opposite ends of the racetrack arrangement. The racetrack arrangement RT can optionally consist of the two side regions SR and the two turnaround regions TA. It is to be understood, however, that the magnet assembly 300 can alternatively be configured in various other arrangements so as to create racetracks of different shapes.

As is perhaps best appreciated by referring to FIG. 7, the series of inner magnets 70 and the series of outer magnets 70' can advantageously be coupled so as to constitute a series of adjacent magnet pairs, with each pair consisting of an inner magnet 70 and an outer magnet 70'. As illustrated, the two magnets 70, 70' of each adjacent magnet pair are spaced apart so as to confront each other. In some cases, the space directly between the two magnets 70, 70' of each adjacent magnet pair is devoid of any magnet. In such cases, for example, there is no permanent magnet located directly between the two primary magnets 70, 70' of each adjacent magnet pair.

In FIGS. 1-4 and 7-10, the inner 70 and outer 70' magnets are shown as discrete permanent magnets. More generally, though, each magnet assembly segment 500 can have two or more permanent magnets, two or more coils, one permanent magnet and one coil, etc. In some cases, the magnetic backing plate 60 is (e.g., the plate segments 64, 65 thereof are each) formed of iron. In other cases, cobalt or nickel is used.

In FIGS. 1-4 and 7-10, the backing plate 60 of each magnet assembly segment 500 comprises (e.g., is) a two-part plate against which an inner magnet 70 and an outer magnet 70' are mounted. In more detail, the illustrated inner 70 and outer 70' magnets are both mounted alongside (e.g., carried against) a single side of the backing plate 60. Thus, the backing plate 60 and two magnets 70, 70' of each magnet assembly segment 500 preferably collectively form a U-shaped configuration in which the backing plate defines a base and the two magnets define sides. In such cases, a channel 59 is formed collectively by the backing plate 60 and the spaced-apart, confronting magnets 70, 70'. As noted above, this channel 59 preferably is devoid of any magnet. For example, there preferably is no secondary (or "auxiliary") magnet in the channel 59.

As noted above, the magnet assembly segments 500 preferably are mounted end-to-end so as to collectively form the racetrack arrangement RT. This can be appreciated by referring to FIGS. 5, 7, and 8. In the embodiments illustrated, the segments 500 are carried against one another, optionally such that adjacent segments are in contact with each other. In some cases, the magnet assembly segments are mounted end-to-end so as to be spaced apart from one another. In such cases, spacers, mounting hardware, and/or other components may be located between adjacent magnet assembly segments.

In preferred embodiments, a plurality of the magnet assembly segments 500 are located at (e.g., define) each of the curved turnaround regions TA. In such embodiments, at each curved turnaround region TA there are multiple, independently adjustable magnet assembly segments 500. Preferably, at least three of the magnet assembly segments 500 define each of the curved turnaround regions TA, such that at each curved turnaround region there are at least three independently adjustable magnet assembly segments. Reference is made to FIG. 8, wherein four of the magnet assembly segments 500 are located at (e.g., define) each of the curved turnaround regions TA, such that at each curved turnaround region there are four independently adjustable magnet assembly segments. In other embodiments, each curved turnaround region is formed by two independently adjustable magnet assembly segments. The two independently adjustable magnet assembly segments at each curved turnaround region may correspond to the two regions A, B shown at each end of FIG. 6.

In certain embodiments, each magnet assembly segment 500 at each curved turnaround region TA is a magnet assembly corner segment having a sector shape. In some cases, there are at least two, or at least three (e.g., four) such magnet assembly corner segments at each curved turnaround region. FIG. 8 shows one such embodiment. Here, each magnet assembly corner segment has a generally triangular configuration, such that when the magnet assembly corner segments are assembled together, they collectively form a semi-circular (e.g., half circle) shape.

As described above, each magnet assembly segment 500 preferably comprises at least one magnetic backing plate segment 64 that is independently moveable selectively toward or away from a corresponding magnetic backing plate segment 65. It can thus be appreciated, e.g., with reference to FIG. 7, that at least one magnetic backing plate segment 64 of each magnet assembly segment 500 preferably can be moved individually in either direction of arrow Y. This allows the magnet assembly segments 500 to be adjusted individually without actually changing the respective distances of their permanent magnets 70, 70' from the adjacent rear surface 91 of the target 90. By adjusting the magnet assembly segments 500 individually in this manner, an operator can locally adjust the sputtering rate. Thus, it is possible to tailor the sputter deposition assembly 100 for each process to be carried out and/or to make changes over time as a process progresses. The particular lateral positions desired for the laterally moveable plate segments 64 of the different magnet assembly segments 500 can be optimized for each unique process to be conducted. Moreover, as a particular process proceeds, it is possible to fine tune the resulting film uniformity based on changes in the process over time (as may result from the target becoming increasingly consumed, etc.).

As noted above, the magnet assembly 300 can optionally have a plurality of individually adjustable segments 500 at each curved turnaround region TA. Thus, in the embodiment of FIG. 8, the moveable plate segments 64 of the magnet assembly segments 500 can be moved individually in either direction of arrow Y. This allows an operator to adjust the sputtering rate locally, not only along the side regions SR of the racetrack RT, but also along each turnaround region TA. This is advantageous in it can be particularly challenging to maintain uniformity between the side regions and the turnaround regions.

It can thus be appreciated that the present sputter deposition assembly 100 provides exceptional flexibility in terms of contouring the magnetic field 150 locally by independently adjusting the moveable plate segments 64 of different magnet assembly segments 500.

FIG. 9 depicts a sputtering chamber 200 in accordance with certain embodiments of the invention. The sputtering chamber 200 in FIG. 9 is equipped with a single sputtering target 90. While a single planar target is shown, the sputtering chamber can alternatively have a single cylindrical sputtering target. As another alternative, the sputtering chamber can be equipped with two cylindrical targets or two planar targets.

In some embodiments, a control unit 10 is operably coupled with the magnet assembly 300 of a sputtering target 90 in the sputtering chamber 200. Preferably, the control unit 10 is located outside of the sputtering chamber 200, such that an operator can operate the control unit without having to stop sputtering, open the sputtering chamber, or both. In such cases, the operator can adjust the lateral position of one or more (e.g., all) of the moveable plate segments 64 of the different magnet assembly segments 500 while the chamber 200 remains closed (and under vacuum).

When provided, the control unit 10 can be operated in different ways to adjust the magnetic field 150. This can be done on demand, e.g., by virtue of an operator using the control unit 10 to initiate adjustments when desired. Additionally or alternatively, the control unit 10 itself can autonomously initiate automated corrections or adjustments that impact film uniformity. For example, any of a variety of conventional film thickness measurement systems can be incorporated into the sputter deposition system and coupled with the control unit 10. In such cases, the control unit can be adapted to determine when significant thickness non-uniformities are occurring at certain locations on the glass, and automatically make adjustments to improve uniformity.

The invention also provides methods of operating a sputter deposition assembly 100. The sputter deposition assembly 100 can be of the nature described above. For example, it can include a sputtering chamber 200, a sputtering target 90, and a magnet assembly 30. The magnet assembly 300 is mounted adjacent to a rear surface 91 of the target 90. The magnet assembly 300 includes a magnetic backing plate 60 and spaced-apart first 70 and second 70' permanent magnets. The first 70 and second 70' permanent magnets each have a proximal end 79 and a distal end 71. The distal end 71 is further from the target 90 than is the proximal end 79. The method involves using the magnet assembly 300 to create a magnetic field 150 comprising field lines 155 that extend from the proximal end 79 of the first magnet 70, through the sputtering target 90, along an arc located in front of the sputtering target, back through the sputtering target, to the proximal end 79 of the second permanent magnet 70', through the second permanent magnet, along a return path, and to the distal end 71 of the first permanent magnet 70. The return path passes through the magnetic backing plate 60. As noted above, the magnetic backing plate 60 comprises two plate segments 64, 65. In some embodiments, the two plate segments 64, 65 are tapered wedge plates, such as those shown in FIGS. 1 and 2. In other embodiments, the two plate segments 64, 65 include at least one tongue 62 and channel 63 pair. Reference is made to the non-limiting examples shown in FIGS. 3 and 4.

The method involves moving a plate segment 64 laterally between first and second positions. In embodiments like that shown in FIGS. 1 and 2, the magnetic backing plate 60 has a greater total thickness when the moveable plate segment 64 is in its first position than when it is in its second position. In embodiments like those shown in FIGS. 3 and 4, the moveable plate segment 64 includes a tongue 62 that is disposed further into a corresponding channel 63 when in the first position than when in the second position. The (or each) tongue 62 may be bottomed-out in the respective channel 63 in such embodiments. Movement of the plate segment 64 between its first and second positions preferably involves lateral movement along an axis that is parallel (or at least substantially parallel) to the path of substrate travel in the sputtering chamber 200.

In embodiments like the one shown in FIGS. 1 and 2, the method preferably involves moving the two wedge plates 64, 65 selectively toward or away from each other such that slanted camming surfaces 66, 67 of the two wedge plates slide against each other. In such cases, when the moveable wedge plate 64 moves from its first position to its second position, the total thickness of the magnetic backing plate 60 decreases, whereas when the moveable wedge plate 64 moves from its second position to its first position, the total thickness of the magnetic backing plate 60 increases. This can be appreciated by comparing FIG. 1 with FIG. 2.

Movement of the plate segment 64 between its first and second positions preferably changes the strength of a component of the magnetic field 150 parallel to the adjacent front surface 99 of the target 90. If it is desired to increase the local sputtering rate, the plate segment 64 can be moved in a first lateral direction (to the left as seen in FIG. 1) so as to increase the total thickness of the magnetic backing plate 60. As noted above, this reduces the resistance of the return path (or "strengthens the magnetic backing plate"). In contrast, if it is desired to decrease the local sputtering rate, the plate segment 64 can be moved in a second lateral direction (to the right as seen in FIG. 1) so as to decrease the total thickness of the magnetic backing plate 60. This increases the resistance of the return path (or "weakens the magnetic backing plate").

Thus, in some embodiments, the method includes moving the plate segment 64 from its first position to its second position. Additionally or alternatively, the method may involve moving the plate segment 64 from its second position to its first position.

The moveable plate segment 64 can optionally be coupled to a motor 20. When provided, the motor 20 can be coupled to the moveable plate segment 64 directly or via one or more other drive or fastener members. In such cases, the method involves operating the motor 20 to move the plate segment 64 between its first and second positions. This movement can be of the nature described above. The system can optionally include a control unit 10 connected with the motor 20 to control operation of the motor. When provided, the control unit 10 preferably is located at a position external to the sputtering chamber 200, whereby an operator can initiate movement of the plate segment 64 between the first and second positions from outside the sputtering chamber without having to open the sputtering chamber.

As noted above, the magnet assembly 300 preferably has an elongated racetrack configuration that includes two parallel elongated straight regions SR and two curved turnaround region TA. In embodiments of this nature, the magnet assembly 300 preferably includes a series of moveable plate segments 64. In such cases, the method preferably involves laterally moving three or more of the plate segments 64 independently (e.g., relative to the sputtering target 90) such that those three or more plate segments end-up in different, lateral positions.

When provided, the series of moveable plate segments 64 can optionally be coupled respectively to a plurality of motors 20. In such cases, the method preferably involves operating two or more of those motors 20 to move two or more of the plate segments 64 such that they end-up being disposed in different lateral positions. Further, the system can advantageously include a control unit 20 operably coupled with the motors 20 and located at a position external to the sputtering chamber 200. In such cases, an operator can initiate independent movement of one or more of (optionally all) the plate segments 64 without having to open the sputtering chamber.

In certain embodiments, individually adjustable magnet assembly segments 500 are positioned end-to-end along the entirety of the racetrack RT. In other embodiments, individually adjustable magnet assembly segments 500 are provided only at certain locations on the racetrack RT (e.g., locations of particular interest for process control), but not necessarily at all locations along the racetrack RT. For example, the invention provides embodiments wherein the sputter deposition assembly 100 is capable of addressing the so-called "cross-corner effect." Referring to FIG. 5, it will be appreciated that the plasma density at the incoming corner of each turnaround region TA may be greater than at other locations on the racetrack. As a consequence, target erosion may proceed more rapidly at the incoming corners of the turnaround regions TA than at other locations on the racetrack. As depicted schematically in FIG. 5, this can cause the target 90 to be consumed prematurely at the hot spots H. That is, the sputterable material at these hot spots H may be consumed sooner than at other locations on the target 90. Moreover, the higher rate of target erosion at these hot spots can cause non-uniformity of the sputtered film. The present sputter deposition assembly may be particularly advantageous for eliminating or reducing these phenomena.

Thus, in certain embodiments, the invention provides a sputter deposition assembly 100 that can compensate for (i.e., reduce or eliminate) the cross-corner effect. In the present embodiments, the sputter deposition assembly 100 includes a sputtering chamber 200, a sputtering target 90, and a magnet assembly 300. These components can be of the nature described above. The magnet assembly 300, for example, is mounted adjacent to a rear surface 91 of the sputtering target 90. The magnet assembly 30 has a series of primary magnets 70, 70' that generate a magnetic field 150, such that the magnetic field is positioned to establish, adjacent a front surface 99 of the target 90, a plasma racetrack RT around which electrons travel continuously during sputtering and having two generally parallel elongated side lanes SR and two curved turnaround regions TA at opposite ends of the plasma racetrack. Each curved turnaround region TA has an incoming corner region and an outgoing corner region. Reference is made to FIG. 5. The magnet assembly 300 includes a series of magnet assembly segments 500. Each magnet assembly segment 500 includes an inner magnet 70, an outer magnet 70', and a magnetic backing plate 60. In the present embodiments, the series of magnet assembly segments 500 includes two adjustable magnet assembly segments located respectively at the two incoming corner regions of the two curved turnaround regions TA and two adjustable magnet assembly segments 500 located respectively at the two outgoing corner regions of the two curved turnaround regions. The moveable plate segments 64 of these four (optionally all of the) adjustable magnet assembly segments 500 preferably are independently moveable laterally selectively toward or away from respective fixed plate segments 65 in the manner described above.

Thus, in the present embodiments, the moveable plate segment 64 of a magnet assembly segment 500 at an incoming corner region preferably is adjustable relative to the moveable plate segment 64 of an adjustable magnet assembly segment 500 at an adjacent outgoing corner region (by saying "adjacent" here, we refer to the outgoing corner region of the same turnaround region TA). This adjustment changes an incoming-corner-to-outgoing-corner plasma density ratio. By providing independently adjustable magnet assembly segments 500 at the incoming and outgoing corner regions, it is possible to change the magnitude of the plasma density at the incoming corner region relative to the plasma density at the adjacent outgoing corner region. For example, the present magnet assembly 300 can be configured such that a relative adjustment of the moveable plate segment(s) of one or more adjustable magnet assembly segments 500 at an incoming corner region and the moveable plate segment (s) of one or more adjustable magnet assembly segments 500 at the adjacent outgoing corner region establishes a plasma density at the incoming corner region that is substantially equal to the plasma density at the adjacent outgoing corner region. This may result in the strength of the parallel magnetic field component (described above) being substantially the same (e.g., equal) at an incoming corner region as it is at the adjacent outgoing corner region. This is preferably the case for each turnaround region TA.

In the present embodiments, the sputtering chamber 200 and sputtering target 90 can be of the nature described previously. With respect to the magnet assembly 300 in the present embodiments, it may have individually adjustable magnet assembly segments 500 positioned along the entirety of the racetrack RT. This, however, is not required. For example, in the present embodiments, there may simply be one or more individually adjustable magnet segments 500 at each incoming corner of each turnaround region TA and one or more individually adjustable magnet segments 500 at each outgoing corner of each turnaround region. The magnet assembly segments creating the rest of the plasma racetrack may or may not be independently adjustable. Thus, in some embodiments, while the magnet assembly 300 is not adjustable about the entire racetrack RT, it is still capable of compensating for the cross-corner effect.

The invention also provides methods of operating a sputter deposition assembly 100 so as to compensate for the cross-corner effect. In these methods, the sputter deposition assembly 100 includes a sputtering chamber 200, a sputtering target 90, and a magnet assembly 300. The magnet assembly 300 is located adjacent to a rear surface 91 of the target 90. The magnet assembly 300 has a series of primary magnets 70, 70' generating a magnetic field (e.g., a magnetron magnetic field) 150 that establishes, adjacent a front surface 99 of the target 90, a plasma racetrack RT around which electrons are travelling continuously and having two generally parallel elongated side lanes SR and two curved turnaround regions TA at opposite ends of the plasma racetrack. Each curved turnaround region TA has an incoming corner and an outgoing corner. The magnet assembly 300 includes a series of magnet assembly segments 500. Each magnet assembly segment 500 has an inner magnet 70, an outer magnet 70', and a magnetic backing plate 60. The series of magnet assembly segments 500 includes a first adjustable magnet assembly segment 500 located at a first of the incoming corner regions and a second adjustable magnet assembly segment 500 located at a first of the outgoing corner regions. In the present method embodiments, the "first" and "second" adjustable magnet assembly segments 500 are located respectfully at the incoming and outgoing corner regions of the same turnaround region TA. The methods involve independently adjusting the moveable plate segments 64 of the respective first and second adjustable magnet assembly segments 500 so as to position those plate segments in different lateral positions.

Thus, the moveable plate segment 64 of the first adjustable magnet assembly segment 500 is moved to a first lateral position, while the moveable plate segment 64 of the second adjustable magnet assembly segment 50 is moved to a second lateral position. The first and second lateral positions here are different. For example, the first lateral position may give the magnetic backing plate 60 a smaller total thickness than does the second lateral position. In such cases, at the two noted corner regions, there are different strengths of the component of the magnetic field parallel to the adjacent front surface of the target. This may be advantageous to compensate for the above-noted cross-corner effect.

The present methods may involve moving the plate segment 64 of the first adjustable magnet assembly segment 500 laterally relative to the adjacent rear surface 91 of the target 90, moving the plate segment 64 of the second adjustable magnet assembly segment 500 relative to the adjacent rear surface of the target, or moving the moveable plate segments 64 of both of these magnet assembly segments 500 relative to the target.

In the present embodiments, the independent adjustment of the moveable plate segments 64 of the first and second adjustable magnet assembly segments 500 preferably changes an incoming-corner-to-outgoing-corner plasma density ratio. Thus, the magnitude of the plasma density at the incoming corner region relative to the magnitude of the plasma density at the adjacent outgoing corner region preferably changes when the moveable plate segments 64 of the first and second adjustable magnet assembly segments 500 are adjusted independently. For example, some embodiments involve moving the moveable plate segment 64 of the first magnet assembly segment 500 to a first lateral position that gives the magnetic backing plate 60 a lesser thickness than that achieved when the moveable plate segment 64 of the second magnet assembly segment 500 is moved to a second lateral position. Such relative lateral positioning of the moveable plate segments 64 of the first and second magnet assembly segments 500 may decrease the plasma density at the incoming corner region of the turnaround region TA in question. Thus, the present methods may involve moving the moveable plate segment 64 of the first magnet assembly segment 500 laterally, and/or moving the moveable plate segment 64 of the second magnet assembly segment 500 laterally, so as to reduce the incoming-corner-to-outgoing-corner plasma density ratio. In some cases, the method involves performing such an independent adjustment at each turnaround region TA of the racetrack RT.

Thus, by independently adjusting one or more magnet assembly segments 500 at an incoming corner region relative to one or more magnet assembly segments 500 at the adjacent outgoing corner region, the magnitude of the plasma density at the incoming corner region preferably changes relative to the magnitude of the plasma density at the adjacent outgoing corner region. In certain preferred embodiments, the first and second adjustable magnet assembly segments 500 are adjusted independently (optionally together with independently adjusting one or more other magnet assembly segments 500 located at the first incoming corner region and/or together with adjusting one or more other magnet assembly segments 500 located at the first outgoing corner region) so as to make the plasma density at the first incoming corner region substantially equal to the plasma density at the first outgoing corner region. This may result in the strength of the parallel magnetic field component (described above) being substantially the same at the first incoming corner region as it is at the first outgoing corner region. Adjustments of this nature are preferably conducted for both turnaround regions TA. These adjustment methods are advantageous in that they can compensate for the cross-corner effect.

In some embodiments of the present method, the series of magnet assembly segments 500 includes at least three magnet assembly corner segments mounted side-by-side so as to collectively form a curved turnaround region TA, and the method involves independently adjusting the moveable plate segments 64 of the magnet assembly corner segments such that at least one of them is disposed in a different lateral position (e.g., so as to have a different strength of the component of the magnetic field parallel to the adjacent front surface of the target) than at least one other of them.

In some embodiments, the method involves both: i) independently adjusting one or more magnet assembly corner segments, and ii) independently adjusting one or more magnet assembly segments located on an elongated side lane SR of the plasma racetrack RT.

The independent movement of one or more (optionally all) of the moveable plate segments 64 of the magnet assembly segments 500 preferably is initiated by operating a control unit 10 that actuates a plurality of motors 20 to drive the independent movements. The control unit 10 preferably is located at a position external to the sputtering chamber 200, such that an operator initiates the independent movement from outside the sputtering chamber without opening the sputtering chamber (optionally while maintaining a vacuum inside the chamber).

Any method of the present disclosure can optionally involve operating the sputter deposition assembly 100 so as to deposit a film on a substrate (e.g., a glass substrate) S. In some embodiments, the film is deposited at a thickness of less than 3,000 angstroms. In one example, the film includes both indium and tin and is deposited at a thickness of between 200 and 2,000 angstroms. In other embodiments, the film includes silver and is deposited at a thickness of between 50 and 300 angstroms.

While some preferred embodiments of the invention have been described, it should be understood that various changes, adaptations and modifications may be made therein without departing from the spirit of the invention and the scope of the appended claims.

What is claimed is:

1. A sputter deposition assembly comprising a sputtering chamber, a sputtering target, and a magnet assembly, the magnet assembly being mounted adjacent to a rear surface of the sputtering target, the magnet assembly comprising a magnetic backing plate and spaced-apart first and second permanent magnets, the first and second permanent magnets being mounted in fixed positions relative to the sputtering target, the first and second permanent magnets each having a proximal end and a distal end, the distal end being further from the sputtering target than is the proximal end, the first and second permanent magnets having magnetic field orientations opposite of each other and oriented such that a north pole of the first permanent magnet faces toward the sputtering target, whereas a north pole of the second permanent magnet faces away from the sputtering target, the magnet assembly creating a magnetic field comprising field lines that extend from the proximal end of the first permanent magnet, through the sputtering target, along an arc located in front of the sputtering target, back through the sputtering target, into the proximal end of the second permanent magnet, through the second permanent magnet, along a return path, and to the distal end of the first permanent magnet, the return path passing through the magnetic backing plate of the magnet assembly, the magnetic backing plate comprising two tapered wedge plates, the two tapered wedge plates being movable selectively toward or away from each other, such that when the two tapered wedge plates move toward each other a composite thickness of the magnetic backing plate increases, whereas when the two tapered wedge plates move away from each other the composite thickness of the magnetic backing plate decreases.

2. The sputter deposition assembly of claim 1 wherein the sputter deposition assembly is configured such that a component of the magnetic field parallel to an adjacent front surface of the sputtering target changes in strength in response to movement of the two tapered wedge plates selectively toward or away from each other.

3. The sputter deposition assembly of claim 1 wherein neither of the two tapered wedge plates is a permanent magnet, the two tapered wedge plates each being formed of ferromagnetic or ferrimagnetic material.

4. The sputter deposition assembly of claim 1 wherein each of the two tapered wedge plates has a slanted camming surface, the two tapered wedge plates being carried alongside each other such that the two slanted camming surfaces slide against each other in response to the two tapered wedge plates moving toward or away from each other.

5. The sputter deposition assembly of claim 1 wherein the two tapered wedge plates have substantially the same width, and each of the tapered wedge plates has opposed first and second side ends, the magnetic backing plate having first and second configurations, the first configuration characterized by the two tapered wedge plates being carried alongside each other such that the first side ends of the two tapered wedge plates are substantially flush with each other while the second side ends of the two tapered wedge plates are substantially flush with each other, the second configuration characterized by the two tapered wedge plates being carried alongside each other such that the first side ends of the two tapered wedge plates are spaced apart from each other while the second side ends of the two tapered wedge plates are spaced apart from each other, the composite thickness of the magnetic backing plate being greater when in the first configuration than when in the second configuration.

6. The sputter deposition assembly of claim 1 wherein the magnet assembly is mounted adjacent to the rear surface of the sputtering target such that one of the two tapered wedge plates is movable laterally relative to the other of the two tapered wedge plates.

7. The sputter deposition assembly of claim 1 wherein a first of the two tapered wedge plates is mounted in a fixed position relative to the two permanent magnets whereas a second of the two tapered plates is mounted so as to be movable selectively toward or away from said first tapered wedge plate, said first tapered wedge plate having opposed first and second side end regions, the first side end region of said first tapered wedge plate being mounted against the distal end of the first permanent magnet, the second side end region of said first tapered wedge plate being mounted against the distal end of the second permanent magnet.

8. The sputter deposition assembly of claim 1 further comprising a cooling plate that defines a cooling channel through which water is configured to flow during sputtering, the cooling plate being carried alongside the rear surface of the sputtering target such that the cooling channel is located between the first and second permanent magnets.

9. A sputter deposition assembly comprising a sputtering chamber, a sputtering target, and a magnet assembly, the magnet assembly being mounted adjacent to a rear surface of the sputtering target, the magnet assembly comprising a magnetic backing plate and spaced-apart first and second permanent magnets, the first and second permanent magnets each having a proximal end and a distal end, the distal end being further from the sputtering target than is the proximal end, the magnet assembly creating a magnetic field comprising field lines that extend from the proximal end of the first permanent magnet, through the sputtering target, along an arc located in front of the sputtering target, back through the sputtering target, into the proximal end of the second permanent magnet, through the second permanent magnet, along a return path, and to the distal end of the first permanent magnet, the return path passing through the magnetic backing plate of the magnet assembly, the magnetic backing plate comprising first and second plate segments, the first plate segment having a first channel, the second plate segment having a first tongue, the first and second plate segments being moveable selectively toward or away from each other such that the first tongue moves further into the first channel in response to movement of the first and second plate segments toward each other whereas the first tongue retracts away from the first channel in response to movement of the first and second plate segments away from each other, one or both of the first and second plate segments being movable in a direction parallel to the sputtering target, the first and second permanent magnets being mounted in fixed positions relative to the sputtering target.

10. The sputter deposition assembly of claim 9 wherein the sputter deposition assembly is configured such that a component of the magnetic field parallel to an adjacent front surface of the sputtering target changes in strength in response to movement of the first and second plate segments selectively toward or away from each other.

11. The sputter deposition assembly of claim 9 wherein neither of the first and second plate segments is a permanent magnet, the first and second plate segments each being formed of ferromagnetic or ferrimagnetic material.

12. The sputter deposition assembly of claim 9 wherein the first plate segment is mounted in a fixed position relative to the two permanent magnets, whereas the second plate segment is mounted so as to be movable selectively toward or away from the first plate segment.

13. The sputter deposition assembly of claim 9 wherein the first tongue has a leading end and a base end, the first tongue having a tapered configuration such that it becomes increasingly narrow in moving from the base end to the leading end, the first channel having an open end and a closed end, the first channel having a tapered configuration such that it becomes increasingly narrow in moving from the open end to the closed end.

14. The sputter deposition assembly of claim 9 wherein the first plate segment has a second channel, and the second plate segment has a second tongue, the sputter deposition assembly configured such that the first and second tongues move respectively further into the first and second channels in response to movement of the first and second plate segments toward each other, whereas the first and second tongues retract respectively away from the first and second channels in response to movement of the first and second plate segments away from each other.

15. The sputter deposition assembly of claim 9 further comprising a cooling plate that defines a cooling channel through which water is configured to flow during sputtering, the cooling plate being carried alongside the rear surface of the sputtering target such that the cooling channel is located between the first and second permanent magnets.

16. The sputter deposition assembly of claim 15, wherein the cooling channel is located directly between the first and second permanent magnets.

17. The sputter deposition assembly of claim 9, wherein the magnet assembly is devoid of any movably-mounted magnetic bodies located directly between the first and second permanent magnets.

18. The sputter deposition assembly of claim 8, wherein the cooling channel is located directly between the first and second permanent magnets.

19. The sputter deposition assembly of claim 1, wherein the magnet assembly is devoid of any movably-mounted magnetic bodies located directly between the first and second permanent magnets.

* * * * *